(12) United States Patent
Takane et al.

(10) Patent No.: US 7,633,063 B2
(45) Date of Patent: Dec. 15, 2009

(54) CHARGED PARTICLE BEAM APPARATUS

(75) Inventors: Atsushi Takane, Mito (JP); Satoru Yamaguchi, Hitachinaka (JP); Mitsugu Sato, Hitachinaka (JP)

(73) Assignee: Hitachi High-Technologies Corporation, Tokyo (JP)

( * ) Notice: Subject to any disclaimer, the term of this patent is extended or adjusted under 35 U.S.C. 154(b) by 248 days.

(21) Appl. No.: 11/599,611

(22) Filed: Nov. 15, 2006

(65) Prior Publication Data

US 2007/0120065 A1    May 31, 2007

(30) Foreign Application Priority Data

Nov. 18, 2005   (JP) ............................. 2005-333511

(51) Int. Cl.
*H01J 47/00* (2006.01)
*G01N 23/00* (2006.01)

(52) U.S. Cl. ...................... 250/310; 250/306; 250/307; 250/492.22

(58) Field of Classification Search .................. 250/306, 250/307, 310, 492.22

See application file for complete search history.

(56) References Cited

U.S. PATENT DOCUMENTS 6,838,667 B2 * 1/2005 Tsuneta et al. .............. 250/306
6,864,493 B2    3/2005 Sato et al.

FOREIGN PATENT DOCUMENTS

JP    2002-352758 A    12/2002
JP    2003-22771 A    1/2003

* cited by examiner

*Primary Examiner*—David A Vanore
(74) *Attorney, Agent, or Firm*—McDermott Will & Emery LLP

(57) ABSTRACT

A charged particle beam apparatus is provided which can prevent the accuracy of positional shift detection from being degraded owing to differences in picture quality, so that even when the state of a charged particle beam is changed at the time that optical conditions are changed or the optical axis changes with time, an auto adjustment of the optical axis can be realized easily and highly accurately. In the charged particle beam apparatus, evaluation or adjustment of focusing is conducted before the deflection condition of an alignment deflector for optical axis adjustment is changed or a table of focus adjustment amounts in correspondence with deflection conditions of the alignment deflector is provided, whereby when the deflection condition of the alignment deflector is changed, a focus adjustment is carried out in accordance with the table.

14 Claims, 14 Drawing Sheets

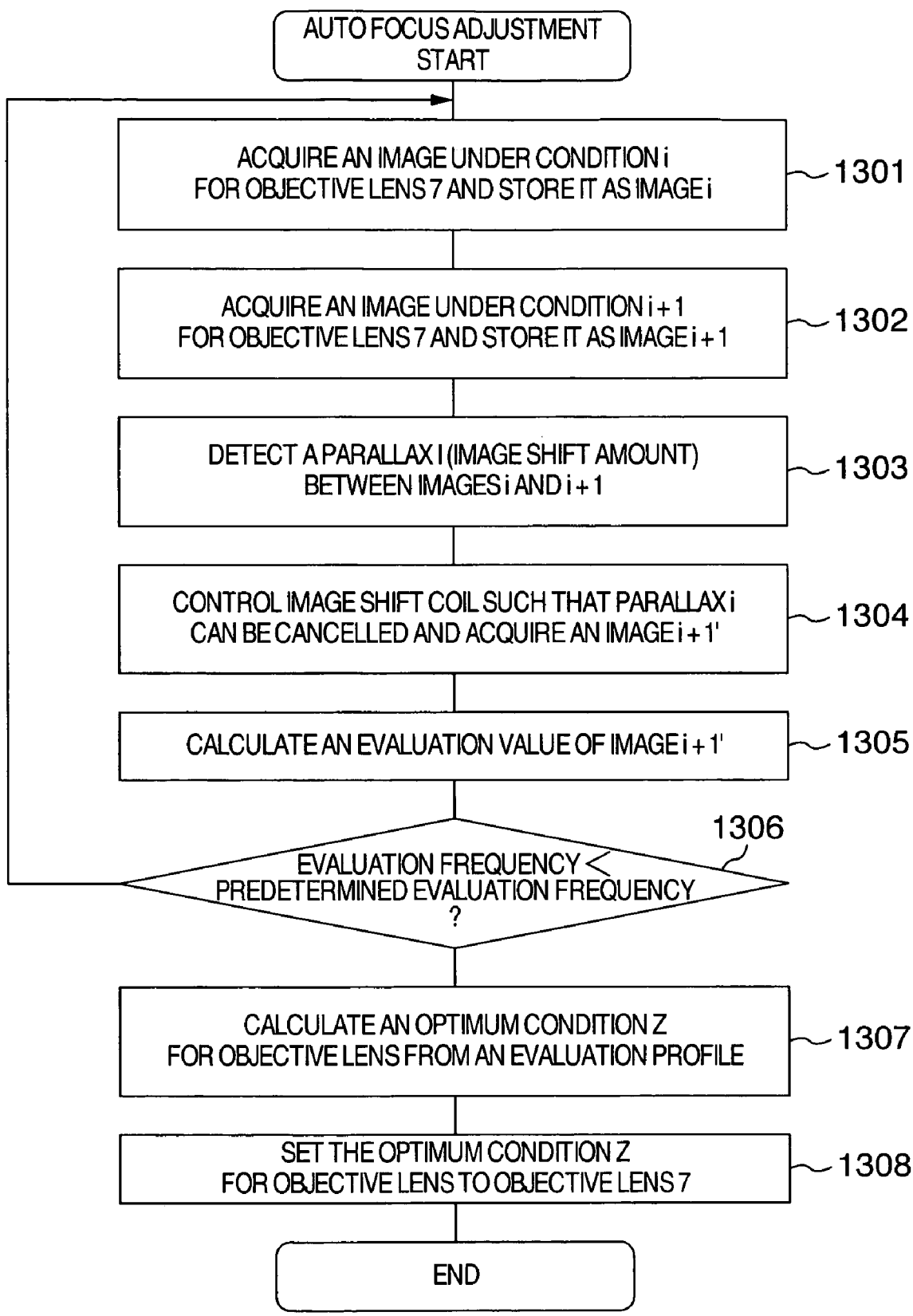

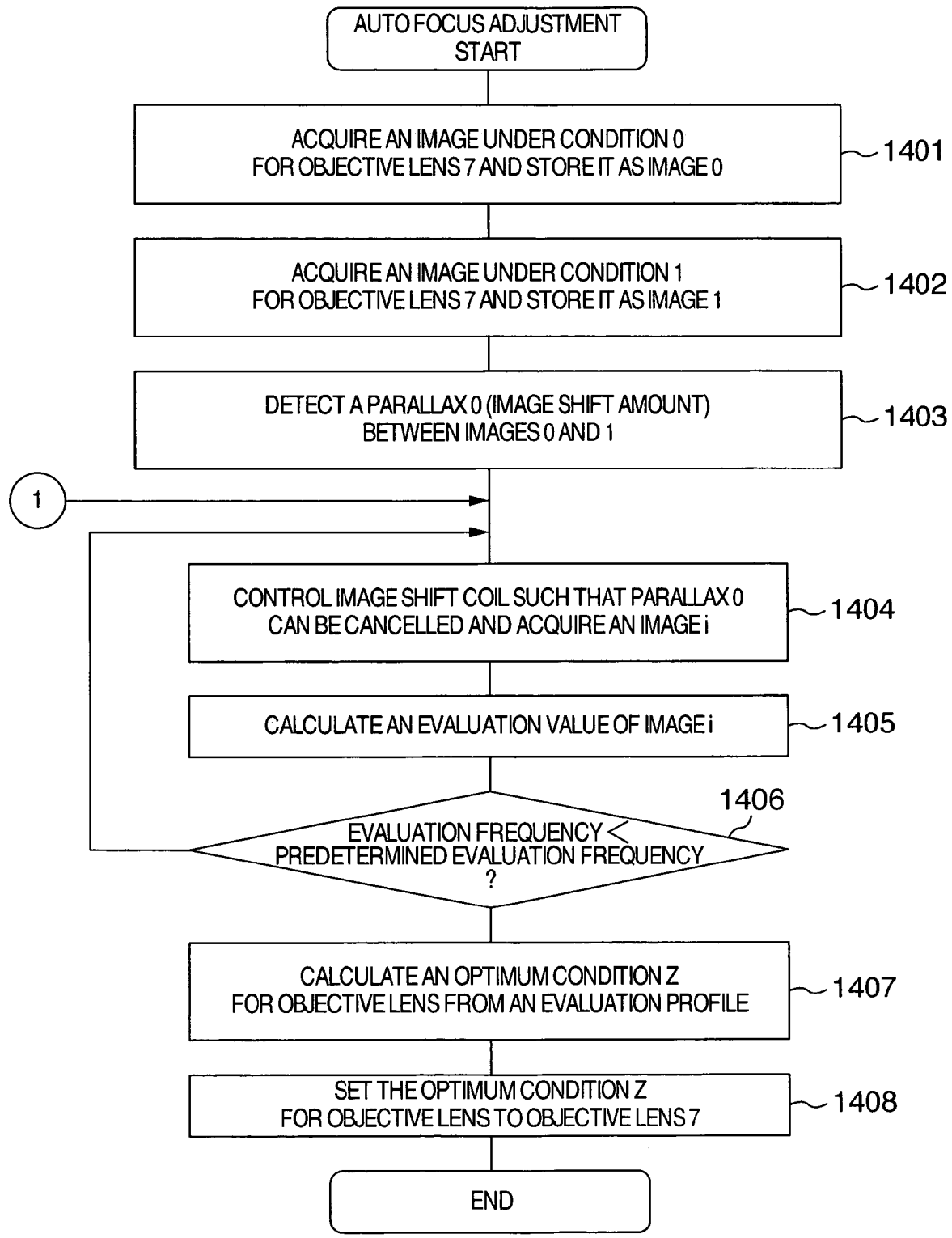

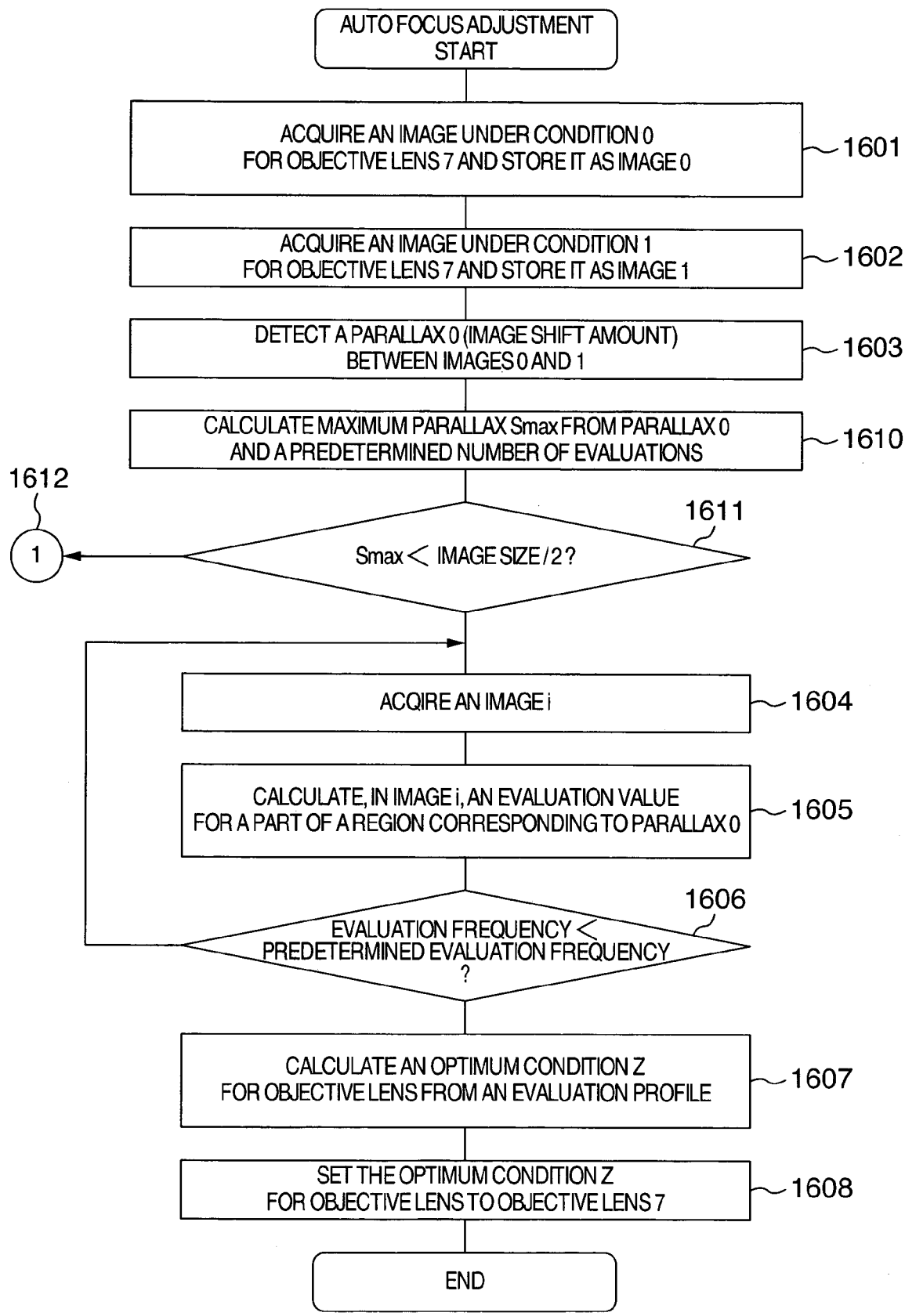

CHARGED PARTICLE BEAM APPARATUS

BACKGROUND OF THE INVENTION

The present invention relates to charged particle beam apparatus and more particularly to a charged particle beam apparatus suitable for obtaining a high-resolution image stably by correcting a shift or misalignment of the optical axis of a charged particle beam optical system with high accuracies.

In the charged particle beam apparatus typified by a scanning electron microscope, a thinly focused charged particle beam is scanned on a specimen to obtain desired information therefrom (for example, a specimen image). When, in this type of charged particle beam apparatus, the optical axis deviates in relation to a lens, the lens undergoes an aberration and the resolution of a specimen image is degraded. Therefore, for the sake of obtaining a specimen image of high resolution, a highly accurate adjustment or alignment of axis is needed. JP-A-2002-352758 (Patent Document 1) and JP-A-2003-22771 (Patent Document 2) disclose techniques for making an axis adjustment automatically.

In general axis adjustment, a deflector (aligner) for axis alignment is adjusted so that the amount of a movement of a specimen image, occurring when a condition of an optical element such as an objective lens is changed, can be minimized. Contrarily, the techniques disclosed in Patent Documents 1 and 2 describe a method according to which the deflection condition of the alignment deflector and the state of the optical element as well are changed to obtain specimen images, an amount of a shift between the thus obtained specimen images is calculated under individual conditions and the shift amount is applied to an equation to determine an operational condition of the alignment deflector. The method as above can facilitate the optical axis adjustment even when optical conditions are changed or when the state of a charged particle beam changes as the optical axis changes with time, thus realizing highly accurate auto optical axis alignment or self-optical axis alignment.

Even in the method disclosed in Patent Documents 1 and 2 capable of realizing the self-optical axis alignment, there is a need of further promoting the accuracy. When the deflection condition of alignment deflector and the optical element state are both changed, an obtained image is deteriorated in quality suffering from, for example, a blur and a positional shift amount cannot sometimes be calculated accurately.

The relation between a shift of alignment condition (misalignment) and an image blur will be explained with reference to FIG. 8. When the objective current value for focus control is swung under condition that the alignment condition is undisturbed and the optical axis is thoroughly adjusted or aligned, the beam diameter changes as shown at 801 in FIG. 8. The in-focus state takes place with the beam diameter minimized. In this case, by swinging the object current value by $+\Delta F$ and $-\Delta F$ from the value for in-focus state, the beam diameter assumes A at both the swung values and images are blurred substantially equally. As a result, images picked up at $+\Delta F$ and $-\Delta F$ are substantially identical in quality and a positional shift between the two images can be detected correctly.

On the contrary, the state changes as shown at 802 with the alignment condition disturbed. In such an event, the beam diameters at $-\Delta F$ and $+\Delta F$ are B and C, respectively, differing greatly from each other. In other words, two images blur extremely differently, causing a large difference in their picture quality, and the accuracy of detection of a positional shift between the two images is deteriorated.

SUMMARY OF THE INVENTION

An object of the present invention is to provide a charged particle beam apparatus which can prevent a degradation of positional shift detection accuracy due to a difference in picture quality as described above and can realize self-optical axis alignment easily and highly accurately even when the optical conditions are changed or the state of a charged particle beam changes with time.

To accomplish the above object, according to this invention, a charged particle beam apparatus is proposed in which evaluation or adjustment of focusing is conducted before the deflection condition of an alignment deflector for optical axis adjustment is changed or a table of focus adjustment amounts complying with deflection conditions of the alignment deflector is provided, whereby when the deflection condition of the alignment deflector is changed, a focus adjustment is carried out in accordance with the table.

With the construction as above, irrespective of the optical conditions for a charged particle beam, highly accurate axis alignment can be executed automatically. Other constitutions of the present invention will be detailed by describing embodiments thereof.

As described above, according to the present invention, highly accurate axis adjustment can be carried out irrespective of optical conditions for the charged particle beam apparatus.

Other objects, features and advantages of the invention will become apparent from the following description of the embodiments of the invention taken in conjunction with the accompanying drawings.

BRIEF DESCRIPTION OF THE DRAWINGS

FIG. 13 is a schematic flowchart of an auto focus adjustment carried out in FIGS. 10, 11 and 12 according to an embodiment of the invention.

FIG. 14 a schematic flowchart of another type of auto focus adjustment carried out in FIGS. 10, 11 and 12 according to an embodiment of the invention.

FIG. 15 is a schematic flowchart of still another type of auto focus adjustment carried out in FIG. 14 according to an embodiment of the invention.

DETAILED DESCRIPTION OF THE EMBODIMENTS

Embodiments of the present invention will now be described with reference to the accompanying drawings.

Figure 1:
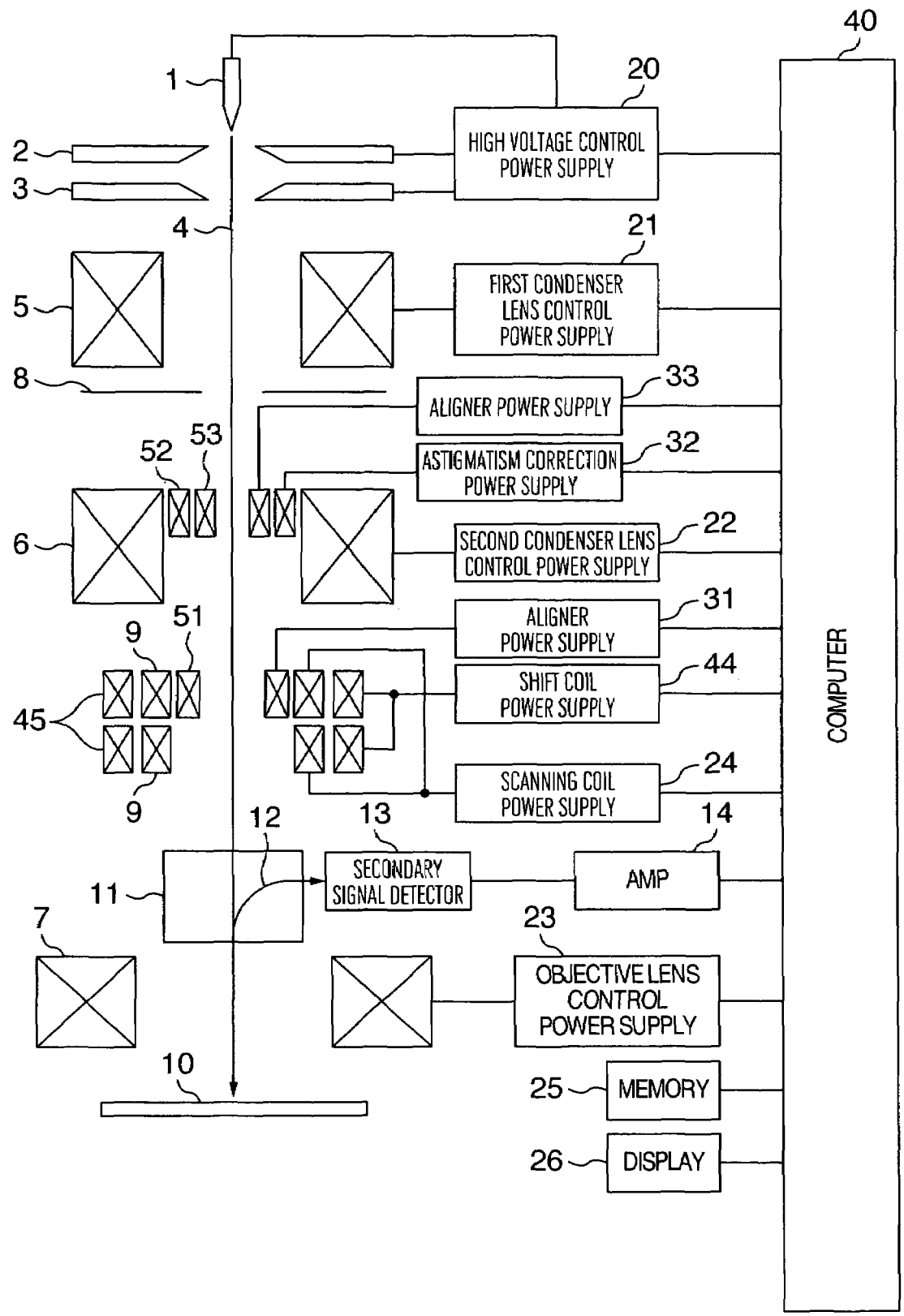
FIG. 1 is a schematic block diagram illustrating an example of a scanning electron microscope according to the present invention.

Referring first to FIG. 1, an example of a scanning electron microscope in this invention is schematically illustrated. A voltage is applied across a cathode 1 and a first anode 2 by means of a high voltage control power supply 20 controlled with a computer 40 so that a primary electron beam 4 may be extracted in the form of a predetermined emission current from the cathode 1. An accelerating voltage is applied across the anode 1 and a second anode 3 by means of the high voltage power supply 20 controlled by the computer 40, so that the primary electron beam 4 emitted from the cathode 1 is accelerated to travel to a lens system of the succeeding stage. The primary electron beam 4 is converged with a first condenser lens 5 controlled by a first condenser lens control power supply 21, removed of its unnecessary region with an aperture plate 8 and then focused into a fine spot on a specimen 10 by means of a second condenser lens 6 controlled by a second condenser lens control power supply 22 and an objective lens 7 controlled by an objective lens control power supply 23. The objective lens 7 may take one of various types such as in-lens type, out-lens type or snorkel (semi-in-lens) type. A retarding scheme may also be employed in which a negative voltage is applied to the specimen to decelerate the primary electron beam. Alternatively, each of the lenses may be constructed in the form of an electrostatic type lens having a plurality of electrodes.

The primary electron beam 14 is scanned two-dimensionally on the specimen 10 by means of a scanning coil 9. A secondary signal 12 indicative of secondary electrons generated from the specimen 10 under irradiation of the primary electron beam proceeds to above the objective lens 7 and thereafter it is separated from the primary electrons by means of a secondary signal separating orthogonal electromagnetic field (EXB) generator 11 so as to be detected by a secondary signal detector 13. A signal detected by the secondary signal detector 13 is amplified with a signal amplifier 14 and is then transferred to an image memory 25, followed by being displayed as a specimen image on an image display unit 26.

A one-stage deflection coil 51 (aligner for objective lens) is arranged in the vicinity of or at the same position as the scanning coil 9 to operate as an aligner for the objective lens. Interposed between the objective lens and the aperture plate is an astigmatism correction coil 52 of eight poles (stigmator) for correcting astigmatic aberrations in X and Y directions. An aligner 53 for correcting axial shifts or deviations of the astigmatism correction coil is arranged in the vicinity of or at the same position as the astigmatism correction coil.

In addition to a specimen image, various kinds of operation buttons for setting the electron optics system and the scanning condition and a button for commanding confirmation of axial conditions and start of self-alignment as well can be displayed on the image display unit 26.

When a focus adjustment is made under a state that the primary electron beam passes through an off-center position of the objective lens (with the axis misaligned), the field of view begins to move as the focus adjustment proceeds. When noticing an axial misalignment, the operator can command start of an axial alignment process through an operation such as clicking the process start button displayed on the display unit by means of a mouse. Receiving the command to conduct axial alignment from the operator, the computer 40 starts a process in accordance with a flow as will be described in the following embodiment.

In FIG. 1, the control processor has been described as being either integral with the scanning electron microscope or comparable thereto but this is in no way limitative and the process to be described below may be carried out with a separately provided control processor. In such a case, there need a transmission medium for transmission of a detection signal detected by the secondary signal detector 13 to the control processor and for transmission of signals from the control processor to the lens and deflector of scanning electron microscope and besides an input/output terminal for inputting/outputting a signal transmitted via the transmission medium. Alternatively, a program to perform the process to be described below may be registered in a memory medium and the program may be executed by means of a control processor having an image memory and being operative to supply a necessary signal to the scanning electron microscope.

The specimen 10 is set on a stage. Movement to a desired position on the specimen or stage can be accomplished by moving the stage 15 in response to a control signal from the computer 40. A pattern dedicated to beam adjustment, that is, a pattern for axis adjustment can be arranged on the stage.

A condition for automatic operation can be set in advance by using the image display unit 26 and an input unit (such as a mouse or keyboard). The condition for automatic operation is saved as a recipe file in a storage unit. The recipe file contains a condition for execution of the auto axis adjustment as well.

A process flow of FIG. 2 will now be described.

In first step, a condition of objective lens 7 at present or a condition determinable on the basis of the present condition (for example, a condition of slight defocus from an in-focus condition at present) is set as condition 1 to the objective lens 7. Subsequently, a condition of aligner 51 at present or a predetermined condition is set as condition 1 to the aligner 51. An image 1 is acquired under the objective lens condition 1 and aligner condition 1.

In second step, with keeping the condition of aligner 51 intact, only the condition of objective lens is set to a second focus condition resulting from shifting the objective lens condition 1 by a predetermined value and an image 2 is acquired with this second focus condition.

In third and fourth steps, the condition of aligner 51 is changed to a second condition 2 resulting from shifting the condition 1 by a predetermined value and the second condition 2 is set to the aligner 51. Then, the objective lens condition is set to condition 1 and condition 2 as in the first and second steps, respectively, and images (images 3 and 4) are acquired under these conditions.

In fifth step, a parallax (image shift) between images 1 and 2 is detected through image processing and registered as parallax 1. For detection of the parallax between the images, an exemplary method can be adopted according to which image correlation values are determined by mutually displacing the images 1 and 2 in a unit of pixel and the parallax is detected on the basis of a shift amount at which a maximum image correlation value is acquired. Any other types of image processing capable of detecting the parallax can be applied to the present embodiment.

In sixth step, a parallax between the images 2 and 3 is detected through image processing and is registered as parallax 2.

In seventh and eighth steps, an optimum value for the aligner 51 is calculated from the parallaxes 1 and 2 and set to the aligner.

Figure 2:
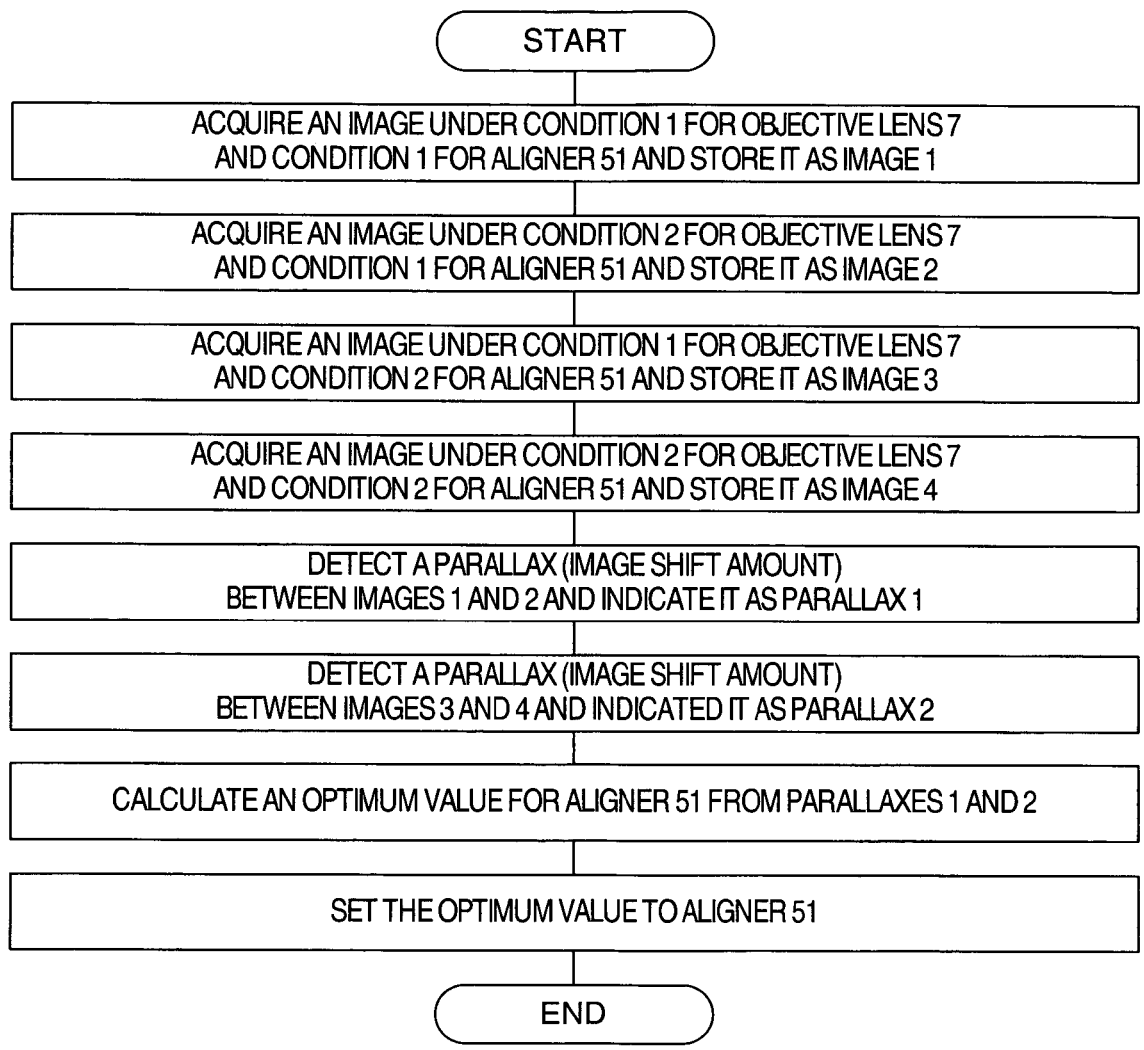
FIG. 2 is a schematic flowchart showing a process of correcting an axis shift relative to an objective lens.

In the process flow of FIG. 2, procedures are illustrated in sequence suitable for better understanding of operation but the order of image fetching does not affect the process. In a practical process, with a view to speeding up processing, it is possible that for example, under the condition of objective lens 7 set to condition 1, images 1 and 3 are fetched sequentially and thereafter, with the condition of objective lens 7 exchanged with condition 2, images 2 and 4 are fetched sequentially. Since the objective lens of electron microscope is usually formed of a magnetic field lens, having a large inductance, a method for consecutively controlling the aligner having a small inductance adaptable for high-speed control is practically effective.

Figure 3:
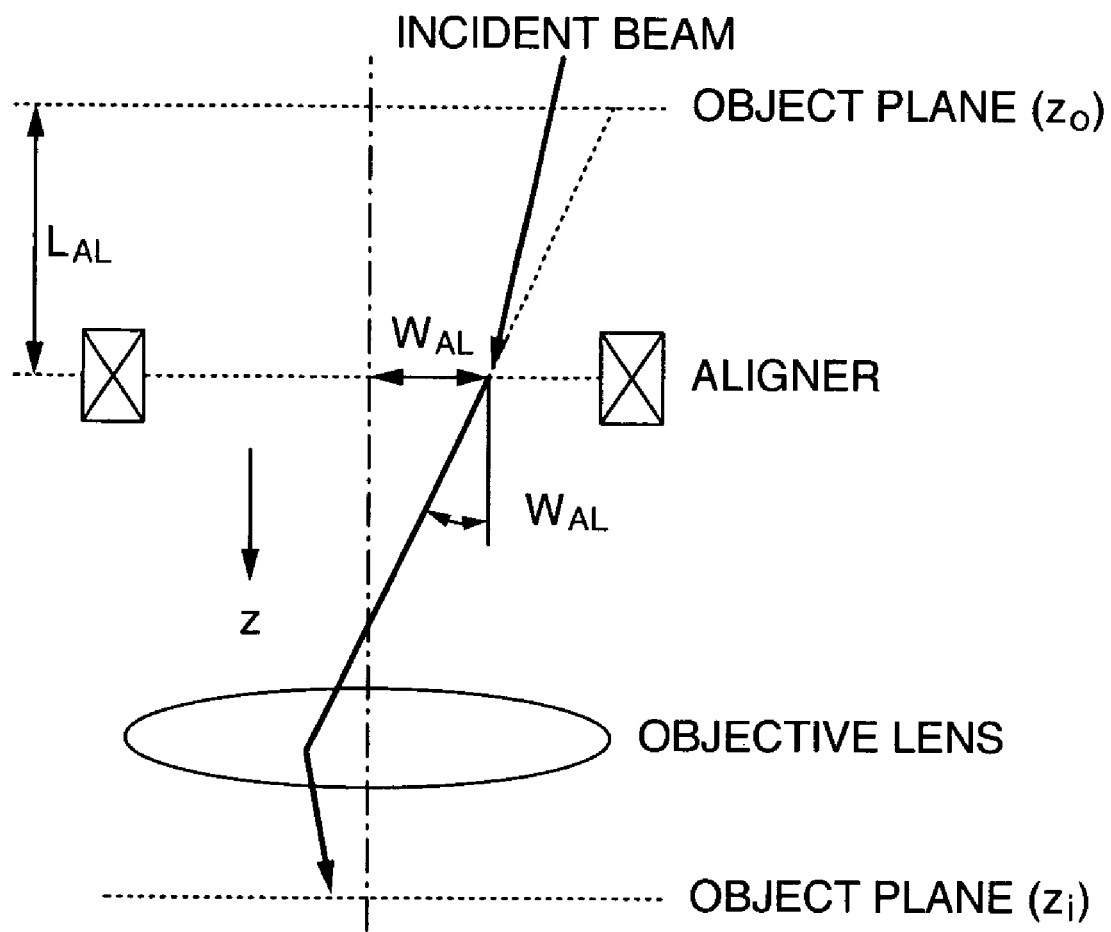
FIG. 3 is a diagram showing the principle of correcting an axis shift relative to an objective lens.

In the process flow of FIG. 2, an axial deviation relative to the objective lens can be corrected on the basis of the principle as will be described with reference to FIG. 3. Where, in the state of axial misalignment, the amount of beam deviation from the axis at the position of aligner 51 (on deflection plane) is WAL (complex variable: $XAL+j \cdot YAL$, j being imaginary unit) and an inclination of the beam to the optical axis at that position is WAL' (complex variable), the trajectory calculation based on the electron optics theory (paraxial theory) can be applied to this situation. When, in the case of a magnetic field type objective lens, an image shift amount (parallax) caused by changing the lens current value from I1 to I2 by $\Delta I (= I1 - I2)$ is $\Delta Wi$ (complex variable: $\Delta Xi + j \cdot \Delta Yi$), $\Delta Wi$ can be expressed as, $$\Delta Wi = K \cdot \Delta I \cdot (WAL \cdot A + WAL' \cdot B) \quad (1)$$

where K, A and B are parameters (complex variables) determined by a misalignment state and operational conditions for the objective lens (such as accelerating voltage and focal distance of the objective lens or position of object plain). The state that the axis deviates in relation to the objective lens has the meaning that $\Delta Wi$ in equation (1) has a value other than 0. Accordingly, according to the conventional technologies, the operator changes the current of objective lens $\Delta i$ periodically to recognize an image shift $\Delta Wi$ at that time and adjusts the condition of aligner such that the image shift can be eliminated. More specifically, an optimum value in order for the aligner to correct the axial deviation meets a condition that the right side in equation (1) is 0 irrespective of $\Delta I$. This condition can be written as, $$(WAL \cdot A + WAL' \cdot B) = 0 \quad (2)$$

and an operational condition for the aligner satisfying this condition provides the optimum value. In the presence of an axial deviation, the axial deviation is accompanied by an inclination of a beam incident on the aligner deflection plane, which is indicated by WAL0', and so a deflection angle (control value) by the aligner indicated by WAL1' is added, so that $$WAL' = WAL0' + WAL1' \quad (3)$$

stands. Therefore, the axial adjustment function purposes to determine a condition WAL1' of aligner satisfying equation (2) (optimum value for aligner). In case the aligner is constructed of an electromagnetic coil, the deflection angle WAL1' is proportional to the coil current. By rewriting equation (1) in the light of the above relation, $$\Delta Wi = \Delta I \cdot (A1 + WAL1' \cdot B1) \quad (4)$$

can be obtained, where A1 and B1 substitute for terms as indicated by equations (5) and (6), respectively.

$$A1 = K \cdot (WAL \cdot A + WAL0' \cdot B) \quad (5)$$

$$B1 = K \cdot B \quad (6)$$

From equation (4), the optimum value WAL1' for the aligner is given by $$WAL1' = -A1/B1 \quad (7)$$

and therefore, by determining A1 and B1, the optimum value for the aligner can be calculated. In equation (4), $\Delta I$ is a current change amount of the objective lens and can be determined as a known value in advance. Accordingly, by setting the aligner to two arbitrary predetermined conditions and detecting a parallax $\Delta Wi$ for $\Delta I$ under the thus set respective conditions through image processing, an equation for determining unknowns A1 and B1 can be obtained from equation (4). Since A1 and B1 can be determined by solving this equation, the optimum condition for aligner can be determined from equation (7).

In other words, by solving the n-th order equation of unknowns such as A and B under the condition that the parallax $\Delta Wi$, obtained when the aligner is set to the two arbitrary predetermined conditions, can be minimized (ideally to 0), the condition independent of the operational conditions for the electron optics system can be derived. On the basis of this condition, the aligner condition (exciting condition for the aligner) can be derived.

The aligner 51 is so arranged or structured as to permit the beam pass position on at least the objective lens principal plane to be controlled two-dimensionally. The reason for this is that if the fulcrum of deflection of the beam by the aligner exists near the objective lens principal plane, the state of axial deviation relative to the objective lens cannot be controlled. Namely, in the case of the alignment deflector (aligner) using an electromagnetic coil as in the embodiment of the invention, the exciting current (deflection signal) to coil which is changeable with the optical conditions can be detected.

For example, the exciting current changeable with a change in the exciting condition for the objective lens and the magnitude of a retarding voltage applied to the specimen can be detected on the basis of optical conditions during observation, so that parameters different for individual optical conditions need not be registered and even when the condition of the beam changes with time, an exciting current to alignment coil which is appropriate to the changed state can be detected.

As described above, the embodiment of the invention can deal with the changeable axis deviation state and operational conditions for the optical element of charged particle beam optics system (for example, beam energy, focal distance and optical magnification), thus facilitating realization of an automated axis adjustment.

On the other hand, an automated axis adjustment is possible for the stigmator 52 in the present embodiment. In the stigmator, function to converge the beam and function to diverge the beam are generated in different directions in a plane orthogonal to the optical axis. Accordingly, if the beam does not pass through the center of an astigmatic aberration correction field, the beam undergoes a deflection action in a direction corresponding to a deviation from the astigmatic aberration correction field center. At that time, the deflection function is also changed cooperatively with the correction of an astigmatic aberration and as a result, an image moves in cooperation with the adjustment operation of astigmatic aberration, making it difficult to perform the adjustment operation.

Conventionally, to correct the inconvenience as above, a signal cooperative with a signal (Xstg, Ystg) of the stigmator 52 is inputted to a different aligner 53 and a resultant movement of an image generated by the aligner 53 is used to cancel a movement of the image by the stigmator.

At that time, where the signal (complex variable) inputted to the aligner 53 is designated by Ws1, this signal is expressed by the following equation.

$$Ws1 = Ksx \cdot Xstg + Ksy \cdot Ystg \quad (8)$$

where Ksx and Ksy are coefficients in terms of complex variables.

Now, with the signal (Xstg, Ystg) of the stigmator changed separately by ΔXstg and ΔYstg, respectively, movements (parallaxes) ΔWix and ΔWiy of an observing image are expressed by equations (9) and (10), respectively.

$$\Delta Wix = \Delta Xstg \cdot (Asx + Bx \cdot Ksx) \quad (9)$$

$$\Delta Wiy = \Delta Ystg \cdot (Asy + By \cdot Ksy) \quad (10)$$

where Asx and Asy are complex variables whose values are determined in correspondence with an axial deviation of the beam relative to the stigmator, Ksx and Ksy are axis adjustment parameters (complex variables) controlled by the apparatus and Bx and By are complex variables determined depending on the position and deflection sensitivity of the aligner and the conditions of the electron optics system. Conventionally, the respective modulation signals of ΔXstg and Δystg are applied to the stigmator and the operator recognizes a movement of the image (ΔWix, ΔWiy) at that time to manually adjust the parameters Ksx and Ksy such that the movement can disappear.

Figure 4:
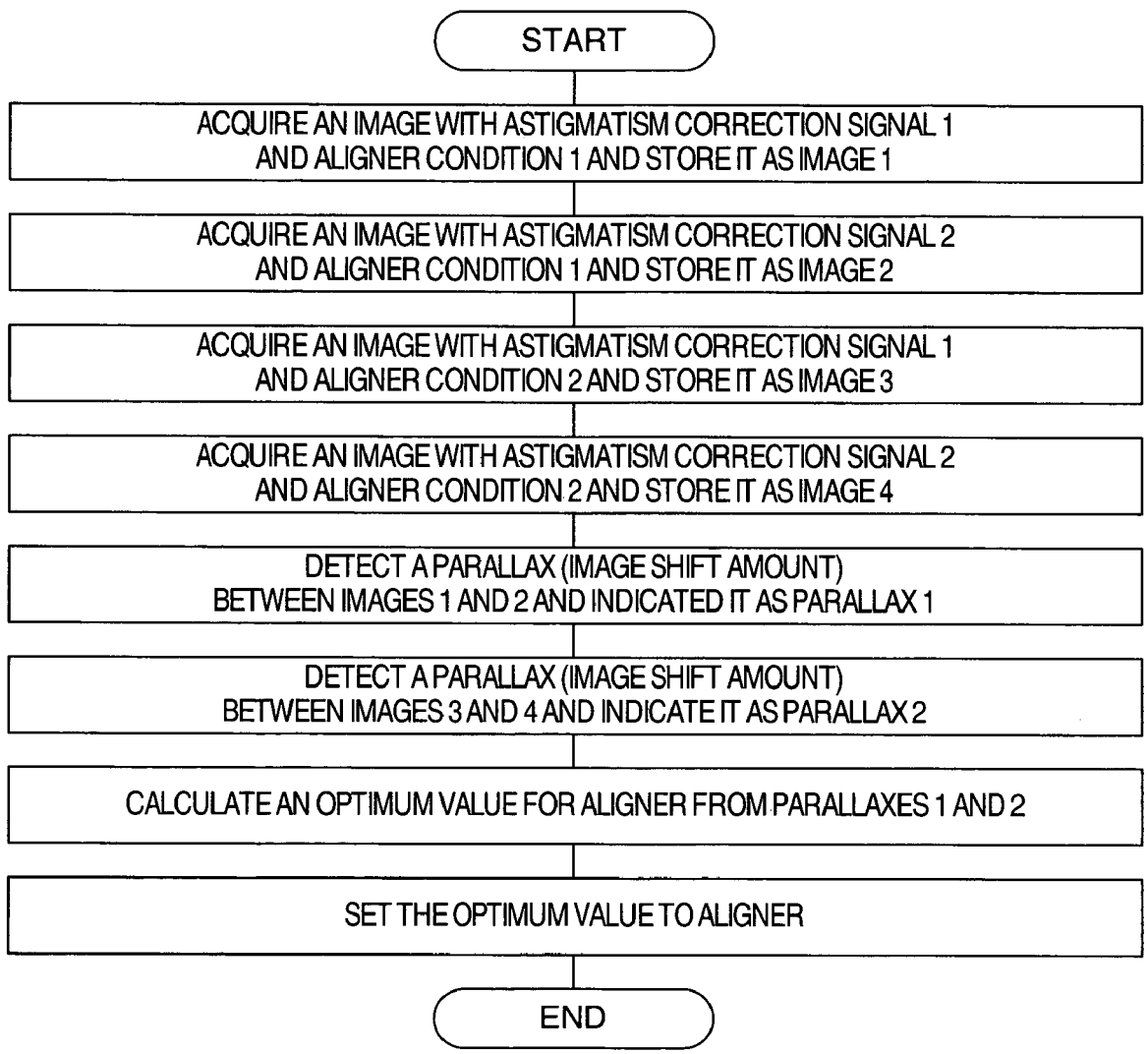
FIG. 4 is a schematic flowchart showing a process of correcting an axis shift relative to a stigmator.

This is an axis adjustment operation applied to the stigmator. Namely, the alignment operation of the axis relative to the stigmator corresponds to an operation of determining coefficients Ksx and Ksy for making ΔWix and ΔWiy zero regardless of ΔXstg and Δystg in equations (9) and (10). Ideally, ΔWix and ΔWiy are to be zeroed but this is not always limitative, leaving room for determination of the coefficients under condition that ΔW is minimized to as approximately zero as possible. The form of each of the equations (9) and (10) is quite the same as that of the previously mentioned equation (4) and hence, by substituting the signal change (ΔXstg, ΔYstg) of the stigmator for the objective lens current value change (ΔI), the optimum control parameter (Ksx, Ksy) for the aligner 53 can be determined through parallax detection and operation process thereof. A process flow to this end is shown in FIG. 4. The aligner for correcting a shift of view field caused by the stigmator corrects the position of the beam on the specimen and therefore, it must be disposed at a position where the beam position on the specimen can be controlled.

The magnitude of axial deviation relative to the stigmator can be determined quantitatively by an image shift (parallax) occurring when a change of ΔXstg and ΔYstg is applied to the signal of stigmator. Accordingly, in the present embodiment, by performing the parallax detection at the time that an operation possibly causing the status of optical axis to change (changing the accelerating voltage, exchanging the specimen or changing the focus position) is carried out, as in the case of axis deviation relative to the objective lens described previously, the status of axis deviation can be displayed to inform the operator of it.

Following this display, the operator can command execution of an alignment process for the stigmator, if necessary, by manipulating an input means displayed on the screen. For example, the input means can be materialized in various forms including clicking a dedicated icon displayed on the monitor by means of a mouse or designating the process on the menu screen.

In order to decide whether the auto axis adjustment explained in connection with the present embodiment is conducted properly, at least four specimen images used for making "a correction based on parallax detection" may be displayed on the image display screen on real time base. While in the foregoing the axis adjustment has been described as being applied to the objective lens and stigmator, this is not limitative and application to the whole of optical elements associated with the charged particle beam, for which optical axis adjustment using the alignment deflector is necessary, is possible. Further, the present invention can be applicable to not only the electron microscope but also to a focused ion beam and all kinds of charged particle beam apparatus for focusing a charged particle beam by using an axially symmetrical lens system. Also, as the deflector for aligner, an electrostatic deflector may be used.

The reason why the highly accurate axis adjustment can be conducted by making a focus adjustment each time that the deflection condition of the alignment deflector is changed will be described below with reference to FIG. 9.

As disclosed in the Patent Documents 1 and 2, the auto axis adjustment method concerning the present invention involves a technique of changing the deflection condition of alignment deflector and the optical element state to calculate amounts of shifts between specimen images occurring under individual conditions and calculating an operational condition for the alignment deflector on the basis of a shift amount. Thus, the calculation of the shift amount between specimen images affects the accuracy of axis adjustment.

Figure 8:
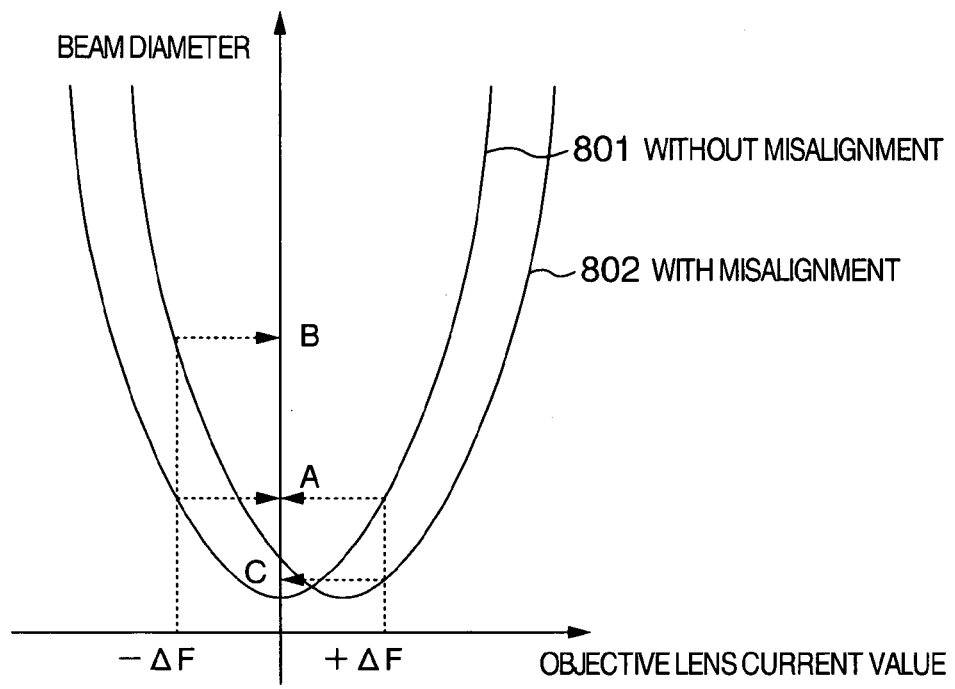
FIG. 8 is a graph showing the relation between a misalignment and an image blur.

As has been described with reference to FIG. 8, when the objective current value is swung to +ΔF and −ΔF with the alignment condition disturbed, the difference in blur state between two images is aggravated leading to a large difference in their picture quality, with the result that the accuracy of detection of a positional shift between the both images is degraded.

Figure 9:
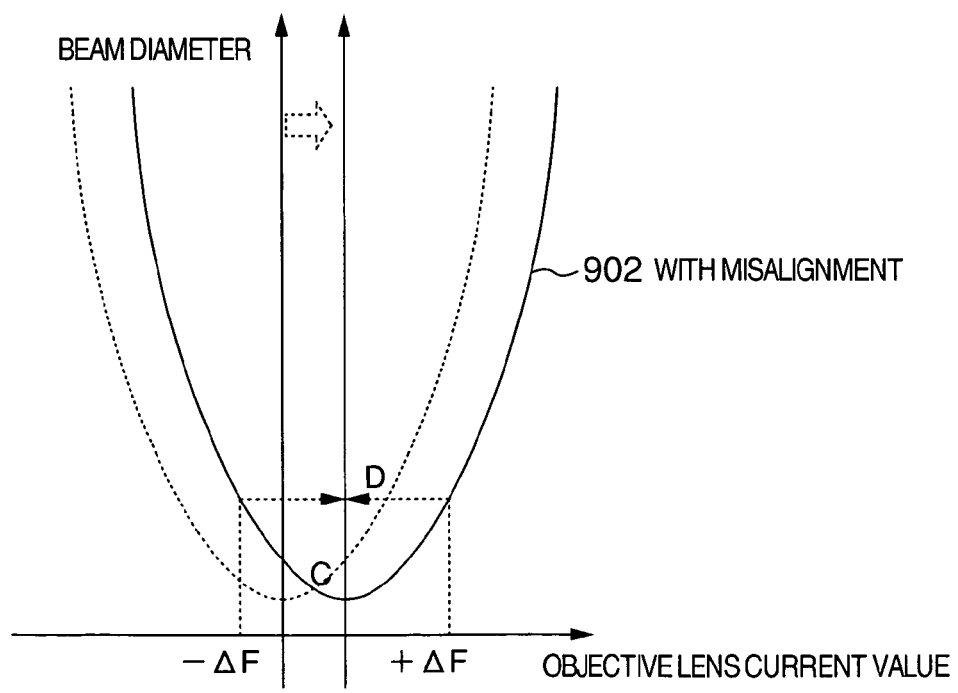
FIG. 9 is a graph showing a focus adjustment carried out under condition that the alignment condition is disturbed.

On the contrary, a state of focus adjustment with the alignment condition shifted is illustrated at 902 in FIG. 9. In this case, when the objective current value is swung from the in-focus state by +ΔF and −ΔF, the beam diameter is the same for the both swung states, amounting to D, and the images blur substantially equally. Accordingly, images picked up at +ΔF and −ΔF can exhibit substantially the same picture quality and a positional shift between the two images can be detected in a good condition.

Thus, when the deflection condition of the alignment deflector is changed, by performing the focus adjustment during each change operation, the images can exhibit substantially the same picture quality in correspondence with changed objective current values and a highly accurate axis adjustment can be performed.

Figure 5:
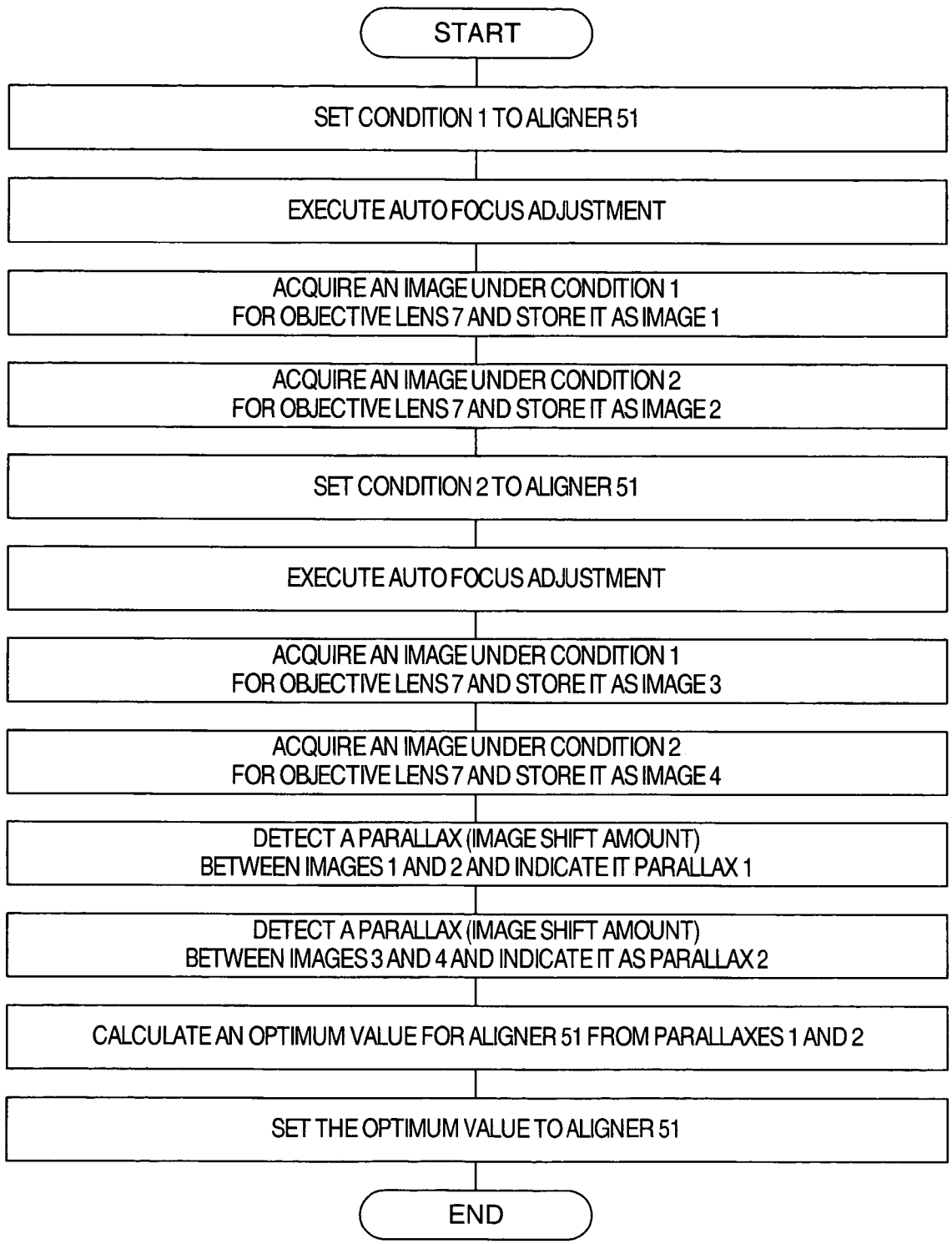
FIG. 5 is a schematic flowchart of correcting an axis shift relative to an objective lens according to the invention.

Referring now to FIG. 5, there is shown a process flow for adjustment of the aligner for objective lens according to an embodiment of the invention. In first step, condition 1 is set to the aligner 51. Since the deflection condition now changes, an auto focus adjustment is executed in second step.

In the auto focus adjustment, the focus condition of the objective lens is controlled automatically so as to be set to an optimum value and in a method to this end, while changing the condition for the objective lens, a plurality of frames are scanned and focus evaluation values are calculated from images obtained through the frame scanning operations and evaluated to enable an optimum value to be set to the condition of the objective lens.

For focus evaluation, a method is used according to which a spatial filter called a differential filter is applied to an image and evaluation is made using a statistic of pixel values. Known as the differential filter are a Sobel filter and a Laplacian filter representing a quadratic differential filter but other spatial filters or a modified method may be available. As the statistic, a pixel value sum, an average, a variance or a standard deviation may be used. The focus evaluation value is calculated with respect to respective frames picked up while changing the condition of the objective lens and a condition of the objective lens at the time that the focus evaluation value is the largest is defined as a condition for in-focus.

In third step, condition 1 (the condition determined on the basis of the in-focus condition obtained in the second step) is set to the objective lens 7 and an image 1 is acquired under the objective lens condition 1 and aligner condition 1.

In fourth step, while keeping the condition for the aligner 51 unchanged, only the condition for the objective lens is set to a second focus condition deviated from the objective lens condition 1 by a predetermined value and then an image 2 is acquired.

In fifth step, a condition determined by deviating the condition for aligner 51 from the condition 1 by a predetermined value is defined as condition 2 which in turn is set to the aligner 51. Since in this phase the deflection condition again changes, an auto focus adjustment is executed in sixth step.

Then, in seventh and eighth steps, the condition for the objective lens is changed to the conditions 1 and 2, respectively, as in the third and fourth steps and respective images (images 3 and 4) are acquired.

In ninth step, a parallax (image shift) between the images 1 and 2 is detected through image processing and is registered as parallax 1. For example, for detection of the parallax between the images, images 1 and 2 are mutually displaced in a unit of pixel to obtain image correlations and the parallax is detected from a shift amount at the time that a maximum image correlation value takes place. Other types of image processing capable of detecting the parallax can be applicable to the present embodiment.

In tenth step, a parallax between the images 3 and 4 is detected through image processing and registered as parallax 2.

In eleventh step, an optimum value for the aligner 51 is calculated from the parallaxes 1 and 2 and is set to the aligner.

As described above, by performing the auto focus adjustment before detecting an image shift amount while changing the condition for lens, the image shift amount can be detected with high accuracy. Then, by further conducting the step of performing the auto focus adjustment and subsequent optical axis adjustment, an optical axis adjustment can proceed stably regardless of temporal changes.

The foregoing description is given by way of example of the auto focus adjustment carried out before operating the aligner but this is not limitative. For example, when a step of evaluating the focus condition prior to optical axis adjustment is provided, the focus adjustment may be caused to proceed when the evaluated focus condition is bad but when a focus evaluation value in excess of a predetermined value can be expected, the aligner may be operated at once without conducting the focus adjustment, proceeding to a step of detecting-an image shift amount. In case an in-focus state is set up originally, the adjustment is not necessarily conducted.

Even after the aligner has been operated, the same result can be obtained if the condition for the aligner is returned as before and evaluation is conducted.

Putting the aforementioned example aside, what counts is to first evaluate the status such as focusing so as to decide whether a highly accurate image shift amount detection can be conducted and so the adjustment per se may be made as necessary. But, for example, when focus adjustment amounts in correspondence with deflection conditions of the alignment deflector are tabulated, a focus adjustment value may be set in accordance with the table each time that the deflection condition of the alignment deflector is changed.

Figure 6:
FIG. 6 is a schematic flowchart of correcting an axis shift relative to a stigmator according to the invention.

Turning to FIG. 6, there is shown a flow of process for adjusting the astigmatism correction aligner according to an embodiment of the invention. In first step, condition 1 is set to the aligner. The deflection condition is now changed, an auto focus adjustment is executed in second step. In third step, a signal of the stigmator is set to condition 1 and an image 1 is acquired under the astigmatism correction signal condition 1 and the aligner condition 1. In fourth step, while keeping the condition for aligner intact, only the condition of astigmatism correction signal is set to a second astigmatism correction signal condition 2 deviated from the astigmatism correction signal condition 1 by a predetermined value and then an image 2 is acquired.

In fifth step, a condition obtained by shifting the condition for aligner by a predetermined value is provided as condition 2 which in turn is set to the aligner. The deflection condition is again changed and therefore, an auto focus adjustment is executed in sixth step.

Then, in seventh and eighth steps, the condition for astigmatism correction signal is set to condition 1 and condition 2 as in the third and fourth steps and respective images (images 3 and 4) are acquired.

In ninth step, a parallax (image shift) between images 1 and 2 is detected through image processing and is registered as parallax 1. In tenth step, a parallax between images 3 and 4 is detected through image processing and is registered as parallax 2. In eleventh step, an optimum value for the aligner is calculated from the parallaxes 1 and 2 and is set to the aligner.

Figure 7:
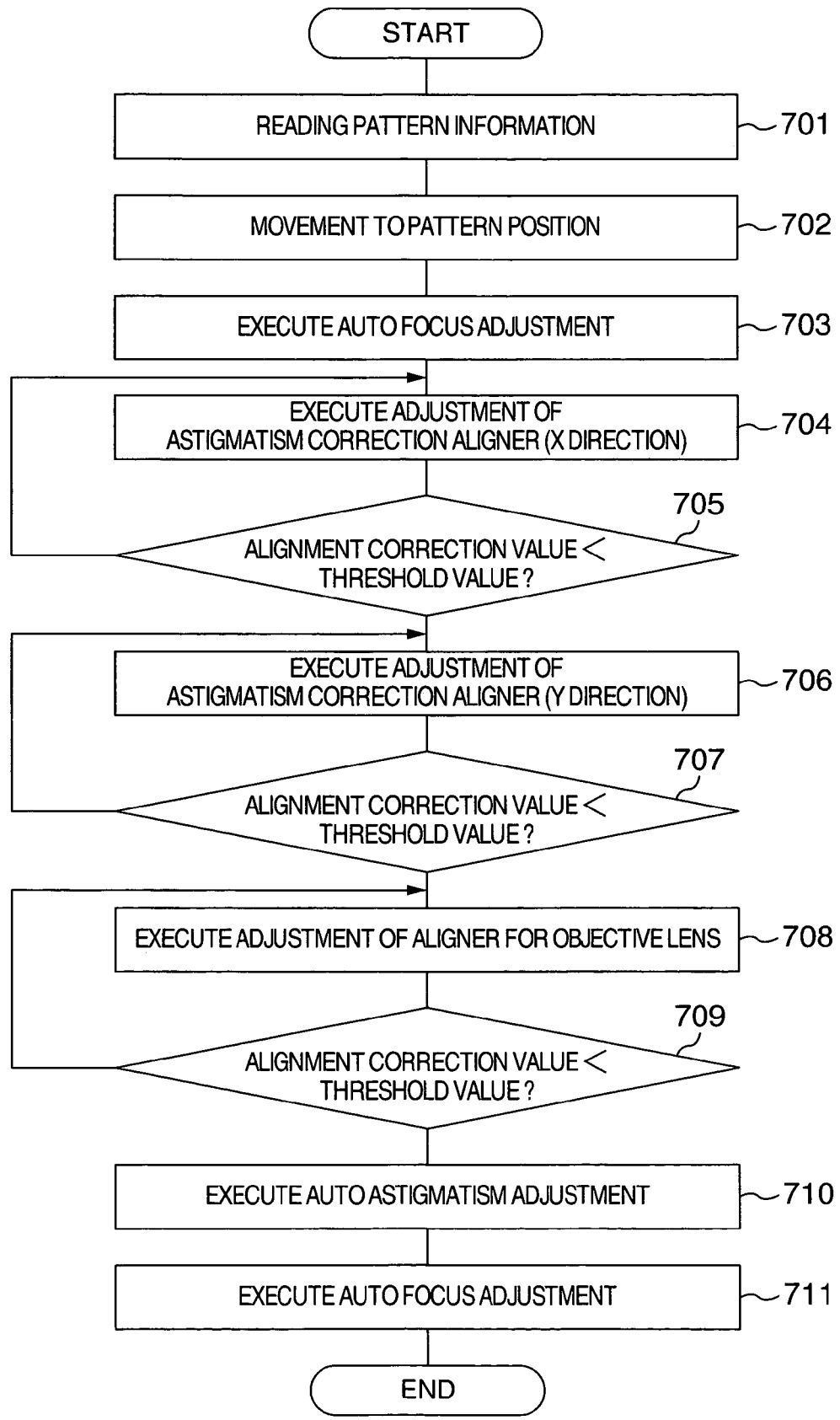
FIG. 7 is a flowchart showing a process of a full-automated adjustment according to the invention.

A flowchart shown in FIG. 7 is for explaining a full-automated adjustment according to an embodiment of the invention. The stage 15 is driven at a predetermined timing to position the axis adjusting pattern directly below an electron beam. After magnification and imaging are set from the pattern information in step 701, an auto focus adjustment is executed in step 702. In step 703, X direction of the aligner 53 for astigmatism correction is adjusted and if an alignment correction value is determined as being larger than a predetermined threshold value in step 705, a retry process proceeds so that an adjustment may be performed again in the step 704. The process in the step 703 has contents as separately shown in the process flow of FIG. 6.

Next, in step 706, Y direction of the aligner 53 for astigmatism correction is adjusted and in step 707, a decision as to whether a retry process is to be conducted is made as in the step 705. Subsequently, in step 708, the aligner 51 for objective lens is adjusted. Processing in the step 708 has the contents as shown in the process flow of FIG. 5. Like the steps 705 and 707, it is decided in step 709 whether a retry process is to be carried out. Next, in step 710, an auto adjustment of astigmatism correction is conducted and finally, in step 711, the focus adjustment is again conducted. For the auto astigmatism correction, the technique disclosed in Patent Document 2 can be used. The adjustment order of the astigmatism correction aligner 53 and objective lens aligner 51 is determined depending on the arrangement of lenses in the electron optics system.

In the case of the electron optics system as shown in FIG. 1, when the axis adjustment is carried out with the astigmatism correction aligner 53 after completion of an adjustment by the aligner 51 for objective lens, the optical axis relative to the objective lens will sometimes be misaligned again and therefore, it is preferable that the adjustment be made sequentially starting from an optical element positioned more closely to the cathode. Conversely, in the case of an electron optics system in which lenses are arranged after a stigmator as viewed from the cathode, the adjustment may preferably be made in order of the aligner for objective lens and the aligner for astigmatism correction.

Figure 10:
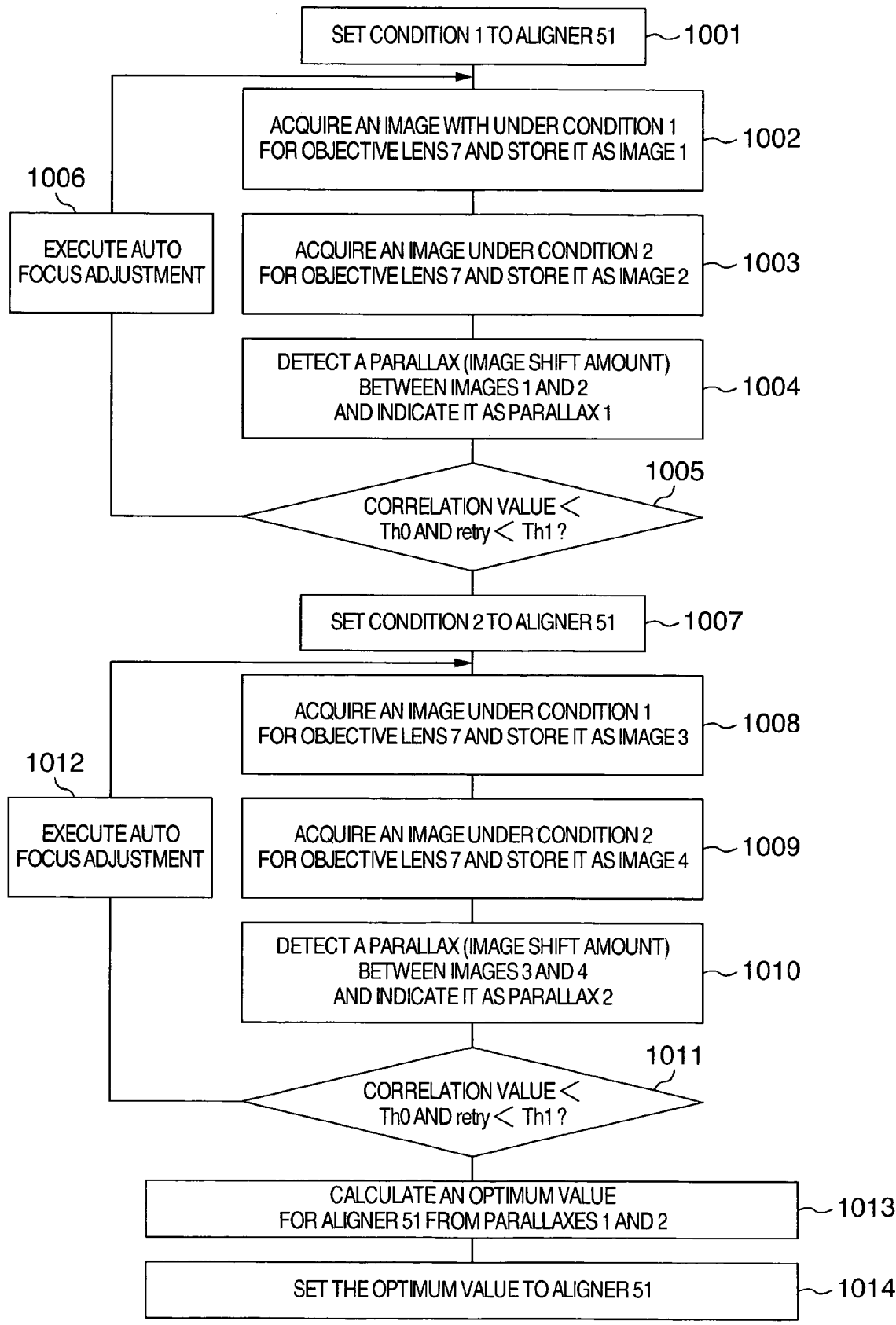
FIG. 10 is a schematic flowchart of a process to be executed when a focus adjustment is made on the basis of correlation values of positioning according to an embodiment of the present invention.

Referring to FIG. 10, there is illustrated a schematic flow when the focus adjustment is carried out on the basis of a correlation value of positioning according to an embodiment of the invention. Particularly illustrated in this figure is a process flow during adjustment of the aligner for objective lens. In step 1001, condition 1 is set to the aligner 51. In step 1002, condition 1 is set to the objective lens 7 and an image 1 is acquired under the objective lens condition 1 and aligner condition 1. In step 1003, while keeping the condition for aligner 51 unchanged, only the condition of objective lens is set to a second condition and an image 2 is acquired. In step 1004, a parallax (image shift) between the images 1 and 2 is detected through image processing and registered as parallax 1. In step 1005, a correlation value between the two images, calculated simultaneously with the detection of the positional shift carried out in the step 1004, is compared with a predetermined threshold (Th0) and when the comparison result is smaller than the threshold value, a focus adjustment is executed in step 1006. Thereafter, processing in the steps 1002 to 1005 is executed reiteratively.

But, a maximum frequency of the reiteration is also determined in advance and when the retry frequency expires, the program proceeds to the next step. Thereafter, in step 1007, the condition of aligner 51 is set to condition 2. Then, like the steps 1002 and 1003, the condition of objective lens is set in steps 1008 and 1009 to condition 1 and condition 2, respectively, and images (images 3 and 4) are acquired under the individual conditions.

In step 1010, a parallax (image shift) between the images 3 and 4 is detected through image processing and is registered as parallax 2. In step 1011, a correlation value between the two images, calculated simultaneously with detection of positional shift amount carried out in the step 1010, is compared with a predetermined threshold (Th0) and when the comparison result is smaller than the threshold value, a focus adjustment is carried out in step 1012. Thereafter, processing in the steps 1008 to 1011 is executed reiteratively. But, a maximum frequency of the reiteration is also determined and when the retry frequency expires, the program proceeds to the next step. In steps 1013 and 1014, an optimum value for the aligner 51 is calculated from the parallaxes 1 and 2 and set to the aligner. The process flow of FIG. 10 is a schematic flow for correcting an axial deviation relative to the objective lens but a process flow for correcting an axial deviation relative to the stigmator can be set up similarly.

Figure 11:
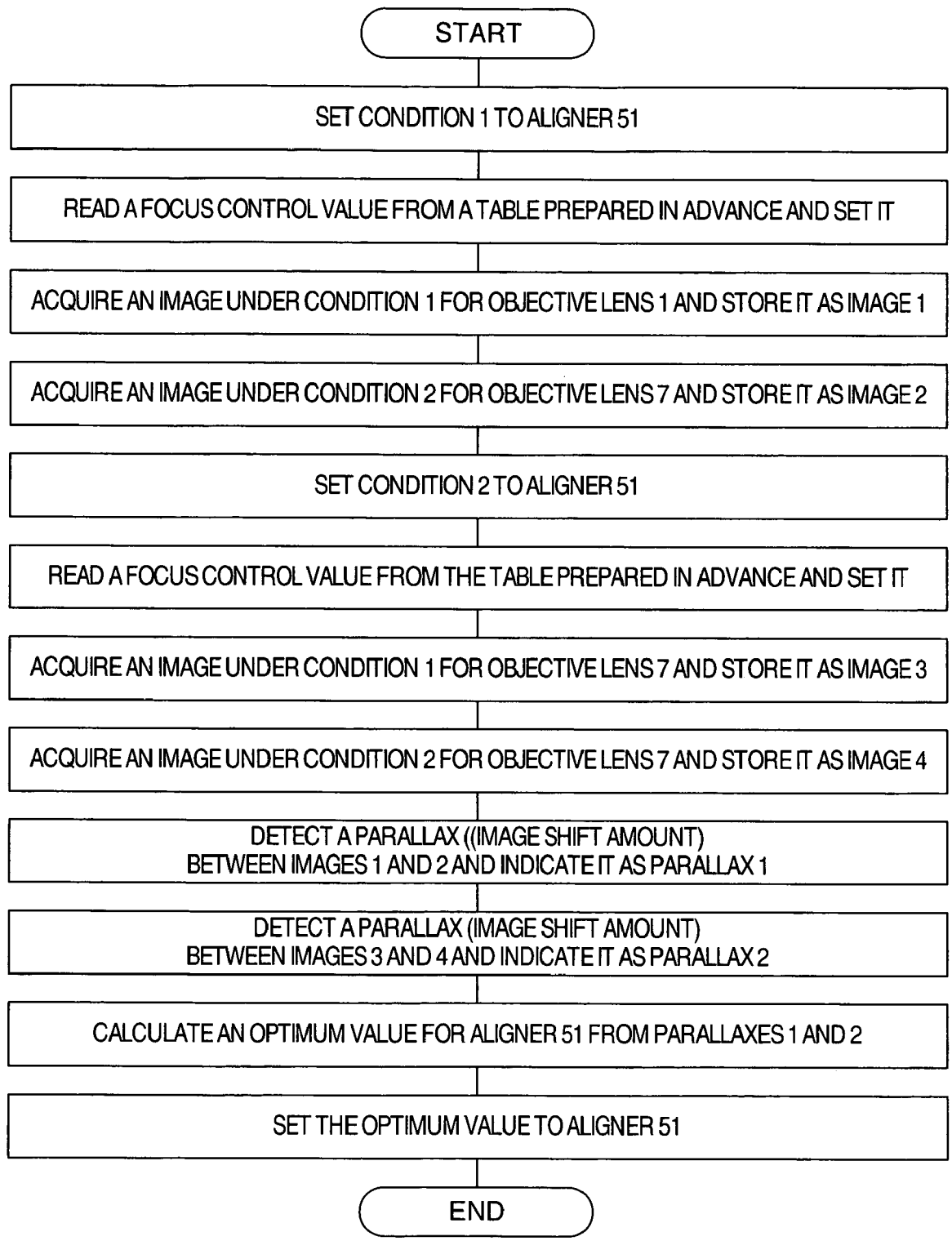
FIG. 11 is a schematic flowchart of a process to be executed when deflection conditions and focus adjustment amounts are tabulated according to an embodiment of the invention.

Turning to FIG. 11, there is illustrated a schematic flow when the deflection condition and the focus adjustment amount are tabulated according to an embodiment of the invention. Specifically illustrated in the figure is a flow of processing when the aligner for objective lens is adjusted. In first step, condition 1 is set to the aligner 51. The deflection condition is now changed and therefore, in second step, a focus control value corresponding to the changed deflection condition is read out of a table prepared precedently and is then set. In third step, condition 1 is set to the objective lens 7 and an image 1 is acquired under the objective lens condition 1 and aligner condition 1.

In fourth step, while keeping the condition for aligner 51 unchanged, only the condition for objective lens is set to a second focus condition which is deviated from the objective lens condition 1 by a predetermined value and an image 2 is acquired. In fifth step: the condition for aligner 51 is deviated from the condition 1 by a predetermined value to provide condition 2 which in turn is set to the aligner 51. In this phase, the deflection condition is now again changed and hence, a focus control value corresponding to the changed deflection condition is read out of the table prepared precedently in sixth step and is then set. Like the third and fourth steps, in seventh and eighth steps, the condition for the objective lens is set to conditions 1 and 2, respectively, and respective images (images 3 and 4) are acquired.

In ninth step, a parallax (image shift) between the images 1 and 2 is detected through image processing and registered as parallax 1. For example, when image correlations between the images 1 and 2 are determined by mutually displacing the images 1 and 2 in a unit of pixel, the parallax between the two images can be detected on the basis of a shift amount between the images at which the image correlation value is maximized. Other types of image processing through which the parallax can be detected can be applicable to the present embodiment.

In tenth step, a parallax between the images 3 and 4 is detected through image processing and registered as parallax 2.

In eleventh step, an optimum value for the aligner 51 is calculated on the basis of the parallaxes 1 and 2 and set to the aligner. The process flow of FIG. 11 is a schematic flow for correcting the axial deviation relative to the objective lens but a process flow for correcting an axial deviation relative to the stigmator can be set up similarly.

By adopting the process flows shown in FIGS. 10 and 11, the processing time consumed for focus control can be mitigated or reduced, thus decreasing the processing time for axial adjustment.

The degree of blur occurring when the aligner value is changed can be calculated from a spherical aberration of the lens. Since the spherical aberration of the lens depends on the distance between lens and specimen (working distance), coefficients of sensitivity of blurs to aligner changes can be held in a table of working distances. This technique is effective for a charged particle beam apparatus in which the working distance changes to a great extent.

Figure 12:
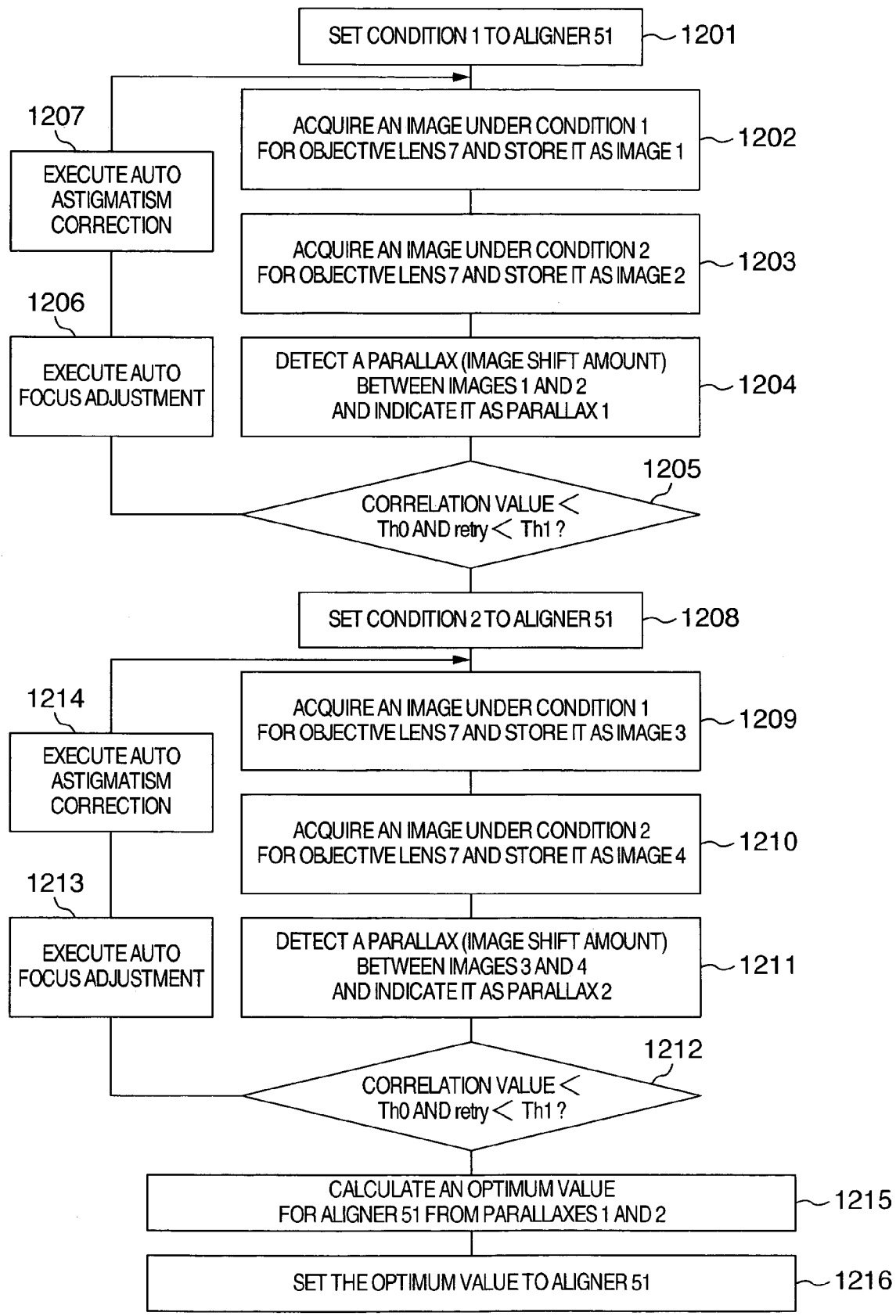
FIG. 12 is a schematic flowchart of a process to be executed when focus adjustment and astigmatism correction are made according to an embodiment of the invention.

In a schematic flowchart shown in FIG. 12, a process flow occurring when the focus adjustment and astigmatism adjustment are carried out according to an embodiment of the invention. Specifically, the process flow in this figure is for adjusting the aligner for objective lens on the basis of the correlation value at the time of positioning. Steps 1201 to 1206 are similar to the steps 1001 to 1006 in FIG. 10. After completion of a focus adjustment in the step 1206, an auto adjustment of astigmatism correction is conducted in step 1207. The auto astigmatism correction is the same as that explained in connection with the step 710 in FIG. 7.

Thereafter, processing in the steps 1202 to 1205 repeats itself. Ensuing steps 1208 to 1216 are similar to the steps 1007 to 1014 in FIG. 10 with the only exception that the auto focus adjustment and auto astigmatism correction are executed in the steps 1213 and 1214, respectively. Like a defocus, a shift of astigmatism invites a degraded picture quality such as blur and therefore, with the aim of ameliorating the accuracy of positional shift detection, the astigmatism adjustment may be conducted simultaneously with the focus adjustment each time that the deflection condition for the alignment deflector is changed. Further, as for the order preference between the focus adjustment and astigmatism correction, by taking into consideration the fact that a degraded picture quality due to a defocus sometimes causes not only a simple blur but also an image run, it is preferable that the focus adjustment be first conducted, followed by the astigmatism correction.

The flowchart of FIG. 12 shows a schematic flow for correcting the axial deviation relative to the objective lens but a flow of a process for correcting an axial deviation relative to the stigmator can be set up similarly.

In the auto focus adjustment during auto axis alignment, the aligner is changed to incline the axis and so there arises a problem that when the objective lens is changed, the image shifts. An embodiment to be described below is for solving this problem by conducting the auto focus adjustment while correcting an image shift. Flowcharts shown in FIGS. 13, 14 and 15 are set up to indicate an example of auto focus adjustment but they can also be applicable to an auto astigmatism adjustment.

A flowchart of FIG. 13 shows details of a flow of an auto focus adjustment conducted in FIG. 10, 11 or 12 in the embodiment of the invention. After condition 0 for the objective lens upon start of the auto focus adjustment is set, the beam is scanned to acquire an image which in turn is stored as image 0 (1301).

Next, condition 1 for the objective lens 7 is set and image 1 is stored likewise (1302). Parallax 0 (image shift amount) between images 0 and 1 is detected through image processing (1303). An image shift coil 45 is so controlled as to cancel the parallax 0 in order that an image 1' in the same view field as that for image 0 can be acquired (1304). An evaluation value of the image 1' is calculated (1305). The above processing is repeated predetermined times to prepare an evaluation profile (1306). An optimum objective lens condition Z is calculated from the thus obtained evaluation profile (1307) and set to the objective lens 7 (1308).

A flowchart of FIG. 14 shows another example of the auto focus adjustment executed in FIG. 10, 11 or 12 in the embodiment of the invention. Like the example of FIG. 13, parallax 0 between images 0 and 1 is detected (1401 to 1403). The image shift coil 45 is so controlled as to correct view field shifts expected to occur subsequently by using the parallax 0, thus acquiring images under this condition, and then evaluation values are calculated predetermined times (1404 to 1406). An optimum objective lens condition Z is calculated from an obtained evaluation profile (1407) and set to the objective lens 7 (1408). Since, in the present embodiment, a parallax between images which are relatively less blurred under conditions 0 and 1 for the objective lens 7 at the time of start of the auto focus adjustment, is detected, the accuracy of parallax can be high.

A flowchart of FIG. 15 shows a schematic flow of another example of the auto focus adjustment executed in FIG. 14 in the embodiment of the invention. Like the example of FIG. 14, parallax 0 between images 0 and 1 is detected (1601 to 1603). A maximum parallax Smax is calculated from a predetermined number of evaluations and parallax 0 (1610). When the Smax is, for example, half or less the image size (1611), a region corresponding to the parallax 0 is cut out in images i sequentially acquired and evaluation values are calculated (1604 to 1605). In case the Smax is larger than half the image size, the ensuing processes coincide with those in the example of FIG. 14. Operation as above is executed predetermined plural times to obtain an evaluation profile and an optimum objective lens condition Z is calculated from the thus obtained evaluation profile and set to the objective lens 7 (1606 to 1608). Through the above processing, acquisition of an image after the parallax correction can be unneeded and speed-up of processing can be assured.

It should be further understood by those skilled in the art that although the foregoing description has been made on embodiments of the invention, the invention is not limited thereto and various changes and modifications may be made without departing from the spirit of the invention and the scope of the appended claims.

The invention claimed is:

1. A charged particle beam apparatus comprising:
   an optical element for adjusting a charged particle beam emitted from a charged particle source;
   an alignment deflector adapted to perform an axis adjustment relative to said optical element; and
   a control unit for evaluating a shift of an image obtained when a condition of said optical element is changed,
   wherein said control unit comprises a control processor and a memory medium storing a program, and
   the program contains instructions, when executed by the control processor, to cause the control unit to adjust focus for focalizing on a specimen surface after setting deflection condition of said alignment deflector for adjusting axis by said alignment deflector, and to change optical condition for obtaining shift of said image after said focus is adjusted.

2. The charged particle beam apparatus according to claim 1, wherein the program further contains instructions to evaluate or adjust said charged particle beam each time that the deflection condition of said alignment deflector is changed.

3. The charged particle beam apparatus according to claim 1, wherein the program further contains instructions to change the deflection condition of said alignment deflector and, from shift amounts between specimen images obtained under respective conditions, determine operational conditions for said alignment deflector.

4. The charged particle beam apparatus according to claim 1, wherein the program further contains instructions to change the deflection condition of said alignment deflector to obtain specimen images, calculate positional shift amounts therebetween, and if a correlation value between the specimen images is less than a predetermined value, adjust focus.

5. The charged particle beam apparatus comprising:
   an optical element for adjusting a charged particle beam emitted from a charged particle beam source;
   an alignment deflector adapted to perform an axial adjustment relative to said optical element; and
   a control unit for evaluating a shift of an image obtained when a condition of said optical element is changed, said control unit including a storage medium for storing a table of focus adjustment amounts in correspondence with deflection conditions of said alignment deflector,
   wherein said control unit comprises a control processor and a memory medium storing a program, and
   the program contains instructions, when executed by the control processor, to cause the control unit, after deflection condition of said alignment deflector is changed, to adjust focus for focalizing on a specimen surface in accordance with said table for adjusting axis by said alignment deflector, and to change optical condition for obtaining shift of said image after said focus adjustment.

6. The charged particle beam apparatus according to claim 5, wherein said table has, as one of a plurality of variables, the distance between a lens and a specimen.

7. A charged particle beam apparatus comprising:
- an objective lens for focusing a charged particle beam emitted from a charged particle beam source;
- a stigmator for compensating an astigmatic aberration of said charged particle beam;
- an alignment deflector adapted to perform an axial adjustment relative to said objective lens and/or said stigmator; and
- a control unit for evaluating a shift of an image when a focusing condition of said objective lens and/or deflection condition of said alignment deflector is changed,
- wherein said control unit comprises a control processor and a memory medium storing a program, and
- the program contains instructions, when executed by the control processor, to cause the control unit to adjust focus for focalizing on a specimen surface of said objective lens and/or astigmatic aberration of said stigmator after change of deflection condition of said alignment deflector for adjusting axis of said alignment deflector, and to change an optical condition for obtaining shift of said image after the focus and/or the astigmatic aberration is adjusted.

8. The charged particle beam apparatus according to claim 7, wherein the program further contains instructions to evaluate or adjust focusing or astigmatism of said charged particle beam each time that the deflection condition of said alignment deflector is changed.

9. The charged particle beam apparatus according to claim 7, wherein the program further contains instructions to change the deflection condition of said alignment deflector and the condition of said optical element and, from positional shift amounts between specimen images obtained under respective conditions, determine operational conditions for said alignment deflector.

10. The charged particle beam apparatus according to claim 7, wherein the program further contains instructions to change the deflection condition of said alignment deflector to obtain specimen images, calculate positional shift amounts therebetween, and if a correlation value between the images is less than a predetermined value, adjust focus and astigmatism.

11. The charged particle beam apparatus according to claim 7, wherein the program further contains instructions, each time that the deflection condition of said alignment deflector is changed, to first adjust focus, followed by adjusting of astigmatism.

12. The charged particle beam apparatus according to claim 7, wherein the program further contains instructions to calculate a positional shift amount between specimen images generated depending on a deflection condition of said alignment deflector and while the positional shift amount being corrected with a different corrector, adjust focus or astigmatism.

13. The charged particle beam apparatus according to claim 7, wherein the program further contains instructions to change once the focus adjustment value or astigmatism adjustment value, calculate, under this condition, an amount of positional shift between specimen images generated depending on a deflection condition of said alignment deflector and, while correcting all positional shift amounts during adjustment by using the calculated positional shift amount, adjust focus or astigmatism.

14. The charged particle beam apparatus according to claim 7, wherein the program further contains instructions to change once the focus adjustment value or astigmatism adjustment value, calculate, under this condition, positional shift amounts between specimen images generated depending on deflection conditions of said alignment deflector and adjust focus or astigmatism by using a part of the positional shift amounts which corresponds to an image acquired during adjustment.

* * * * *